(12) United States Patent
Kloss

(10) Patent No.: US 7,132,130 B1
(45) Date of Patent: Nov. 7, 2006

(54) METHOD FOR PROVIDING A CHROME FINISH ON A SUBSTRATE

(75) Inventor: Terence J. Kloss, Pipersville, PA (US)

(73) Assignee: Innovative Systems Engineering Inc., Warminster, PA (US)

( * ) Notice: Subject to any disclaimer, the term of this patent is extended or adjusted under 35 U.S.C. 154(b) by 0 days.

(21) Appl. No.: 11/134,106

(22) Filed: May 20, 2005

(51) Int. Cl.
B05D 3/00 (2006.01)
C23C 14/00 (2006.01)
C23C 14/06 (2006.01)

(52) U.S. Cl. .................. 427/250; 427/296; 427/255.7; 427/294; 427/295; 204/192.1

(58) Field of Classification Search .......... 427/250, 427/294, 255.7, 295, 296, 404, 405; 204/192.1, 204/192.14, 192.26
See application file for complete search history.

(56) References Cited

U.S. PATENT DOCUMENTS

| | | | |
|---|---|---|---|
| 3,801,357 A | 4/1974 | Baldi | |
| 3,874,901 A * | 4/1975 | Rairden, III | 427/250 |
| 3,922,396 A | 11/1975 | Speirs et al. | 427/250 |
| 4,131,530 A * | 12/1978 | Blum et al. | 204/192.14 |
| 4,183,975 A | 1/1980 | Sidders | 427/50 |
| 4,374,717 A * | 2/1983 | Drauglis et al. | 204/192.14 |
| 4,382,976 A | 5/1983 | Restall | 427/34 |
| 4,407,871 A | 10/1983 | Eisfeller | 428/31 |
| 4,535,024 A | 8/1985 | Parker | 428/200 |
| 4,585,901 A * | 4/1986 | Miller | 174/35 MS |
| 5,284,679 A | 2/1994 | Eisfeller et al. | 427/240 |
| 5,558,909 A | 9/1996 | Poliquin et al. | 427/251 |
| 5,656,335 A | 8/1997 | Schwing et al. | 427/447 |
| 5,773,154 A | 6/1998 | Takada | 428/458 |
| 6,068,890 A | 5/2000 | Kaumle et al. | 427/534 |
| 6,326,057 B1 | 12/2001 | Das et al. | 427/255.26 |
| 6,399,152 B1 | 6/2002 | Goodrich | 427/250 |
| 2004/0154539 A1 | 8/2004 | Feldbauer | 118/719 |
| 2005/0282003 A1* | 12/2005 | Mayzel et al. | 428/336 |

FOREIGN PATENT DOCUMENTS

JP 04-136903 * 5/1992

OTHER PUBLICATIONS

Bernick et al., "Is There a Magnetron in Your Sputtering Future?", Research & Development, pp. 126-129, Oct. 1987.

* cited by examiner

Primary Examiner—Michael E. Lavilla
(74) Attorney, Agent, or Firm—Howson and Howson

(57) ABSTRACT

An environmentally-friendly process for applying a chrome finish on a substrate is provided. The chrome finish comprises a thin film of aluminum and chromium deposited onto the substrate by physical vapor deposition (PVD) techniques. The thin layer can consist of three separately deposited metallic layers including a chromium layer sandwiched between a pair of aluminum layers or can consist of a single, simultaneously co-deposited layer of aluminum and chromium in a ratio of 10% to 70% by weight chromium and 30% to 90% aluminum. The structure of a coated substrate is also disclosed.

14 Claims, 4 Drawing Sheets

METHOD FOR PROVIDING A CHROME FINISH ON A SUBSTRATE

BACKGROUND OF THE INVENTION

The present invention relates to a method for providing a chrome finish on a substrate, and more particularly, the present invention relates to a chroming process that is environmentally-friendly and that produces a rich, bright, reflective chrome coating traditionally desired by the automotive, furnishing, and other industries. The present invention also relates to a coated substrate having a chrome finish.

Conventionally, nickel/chromium and/or chromium is electroplated on aluminum and steel parts and provides an industry standard for a rich, reflective, chrome finish widely accepted, desired, and used in the automotive, furnishing and like industries. Chrome plating requires the use of hazardous solutions and bi-products that present numerous environmental issues and problems. In addition, since chromium is a very hard material, it is well known that a layer of material having high chromium content that is plated on a substrate tends to fracture or "craze" when the substrate is flexed and/or thermally expanded.

U.S. Pat. No. 6,399,152 B1 issued to Goodrich discloses a vacuum metalization process that can be used to apply chrome coatings on aluminum and steel substrates and that addresses the above referenced environmental concerns. The process requires vapor deposition of a nickel/chromium layer on a substrate, and thereafter, the separate vapor deposition of a chromium layer on the pre-deposited nickel/chromium layer. The result is a substrate having a decorative chrome finish that is of a color desired, and in some cases required, by the automotive industry. The coating is believed to provide good resistance to corrosion, and the process can be practiced without the environmental problems experienced in connection with plating processes. However, as stated above, layers of material having high chromium content tend to fracture or "craze" when the underlying substrate is flexed and/or thermally expanded. For example, see U.S. Pat. No. 4,374,717 issued to Drauglis et al. which discloses a method of sputtering a bright metal thin-layer finish on a molded plastic item, such as an automotive trim part. On column 1, lines 34–38, the Drauglis patent acknowledges the concern that thermal cycling can lead to delamination of the coating and that flexing a substrate can cause a sputtered layer to crack and peel.

U.S. Pat. No. 4,535,024 issued to Parker discloses a vapor deposited "black chrome" finish on external automotive trim parts, and U.S. Pat. No. 4,183,975 issued to Sidders and U.S. Pat. No. 4,131,975 issued to Blum et al. disclose sputtered coatings that provide the appearance of bright chromium metal traditionally used in the automotive industry and that possess the requisite corrosion and abrasion resistance for various automotive trim components. U.S. Pat. No. 6,068,890 issued to Käumle et al., U.S. Pat. No. 5,284,679 issued to Eisfeller et al., and U.S. Pat. No. 4,407,871 issued to Eisfeller disclose methods for applying high-stress resistant gloss coatings to articles, such as vehicle wheels, rims, bumpers, and grills, and U.S. Pat. No. 5,558,909 issued to Poliquin et al. discloses an apparatus and method for vapor depositing a metal layer on complex-shaped articles, such as automotive wheels and rims. U.S. Patent Application Publication No. 2004/0154539 A1 and U.S. Pat. No. 5,773,154 issued to Takada, U.S. Pat. No. 5,656,335 issued to Schwing, U.S. Pat. No. 6,326,057 B1 issued to Das et al., U.S. Pat. No. 3,801,357 issued to Baldi, U.S. Pat. No. 3,922,396 issued to Speirs et al., and U.S. Pat. No. 4,382,976 issued to Restall disclose other types of coatings and processes.

While the coatings and processes disclosed in the above referenced patents and published application may function in a satisfactory manner for their intended purposes, there remains a need for a environmentally-friendly process for providing a chrome finish on a substrate. The chrome finish produced by the process should have superior material properties and provide a desired chrome appearance traditionally accepted in the automotive industry.

SUMMARY OF THE INVENTION

The present invention provides a process for applying a chrome finish on a substrate. The chrome finish is a thin film of aluminum and chromium deposited onto the substrate by physical vapor deposition (PVD) techniques. One process contemplated by the present invention requires a first layer of aluminum at least 1000 Å thick to be deposited on the substrate. Thereafter, a separate layer of chromium about 200 Å in thickness is deposited on the first layer of aluminum, and a second layer of aluminum about 100 Å in thickness is deposited on the chromium layer.

In an alternate process according to the present invention, aluminum and chromium are simultaneously co-deposited onto the substrate forming a thin film having a minimum thickness of 1000 Å in a ratio of 10% to 70% by weight chromium and 30% to 90% aluminum. The co-depositing process step can include the use of separate aluminum and chromium sputtering targets positioned within the same vacuum chamber. Alternatively, the co-depositing process step can include the use of an aluminum-chromium alloy sputtering target that comprises 10% to 70% by weight chromium and 30% to 90% by weight aluminum.

According to a further aspect of the present invention, a coated substrate is provided. The substrate is made of glass, plastic, automotive plastics, metal, steel, or aluminum, and a thin vapor deposited film covers the outer surface of the substrate. The film has a minimum thickness of at least 1000 Å and consists essentially of aluminum and chromium deposited on the substrate by physical vapor deposition (PVD). The thin vapor deposited film provides the substrate with a relatively-flexible, corrosion resistant chrome finish. The thin film can consist of a layer of chromium about 200 Å thick sandwiched between inner and outer layers of aluminum, with the inner layer of aluminum having a minimum thickness of 1000 Å and the outer layer of aluminum having a thickness of about 100 Å. Alternatively, the thin film can be a single aluminum-chromium layer containing 10% to 70% by weight chromium and 30% to 90% by weight aluminum.

BRIEF DESCRIPTION OF THE DRAWINGS

The foregoing and other objects, features and advantages of the present invention should become apparent from the following description when taken in conjunction with the accompanying drawings, in which.

DETAILED DESCRIPTION OF THE PREFERRED EMBODIMENT

The process of the present invention is for applying a chrome finish to a substrate. The color, tint, shade, etc. of the finish is of great importance since industries, such as the automotive industry, have very specific requirements. In addition, the process must be able to be accomplished without creating environmental problems.

Examples of substrates to be applied with a finish, or coating, include automotive parts, exterior trim parts, interior trim parts, wheels, rims, hubcaps, bumpers, grills and various furnishings. The substrates can be made, for instance, of glass, plastics, such as automotive plastics, and metals, such as steel and aluminum. In addition, the substrates can be relatively small or relatively large and have simple or complex geometries.

Figure 1:
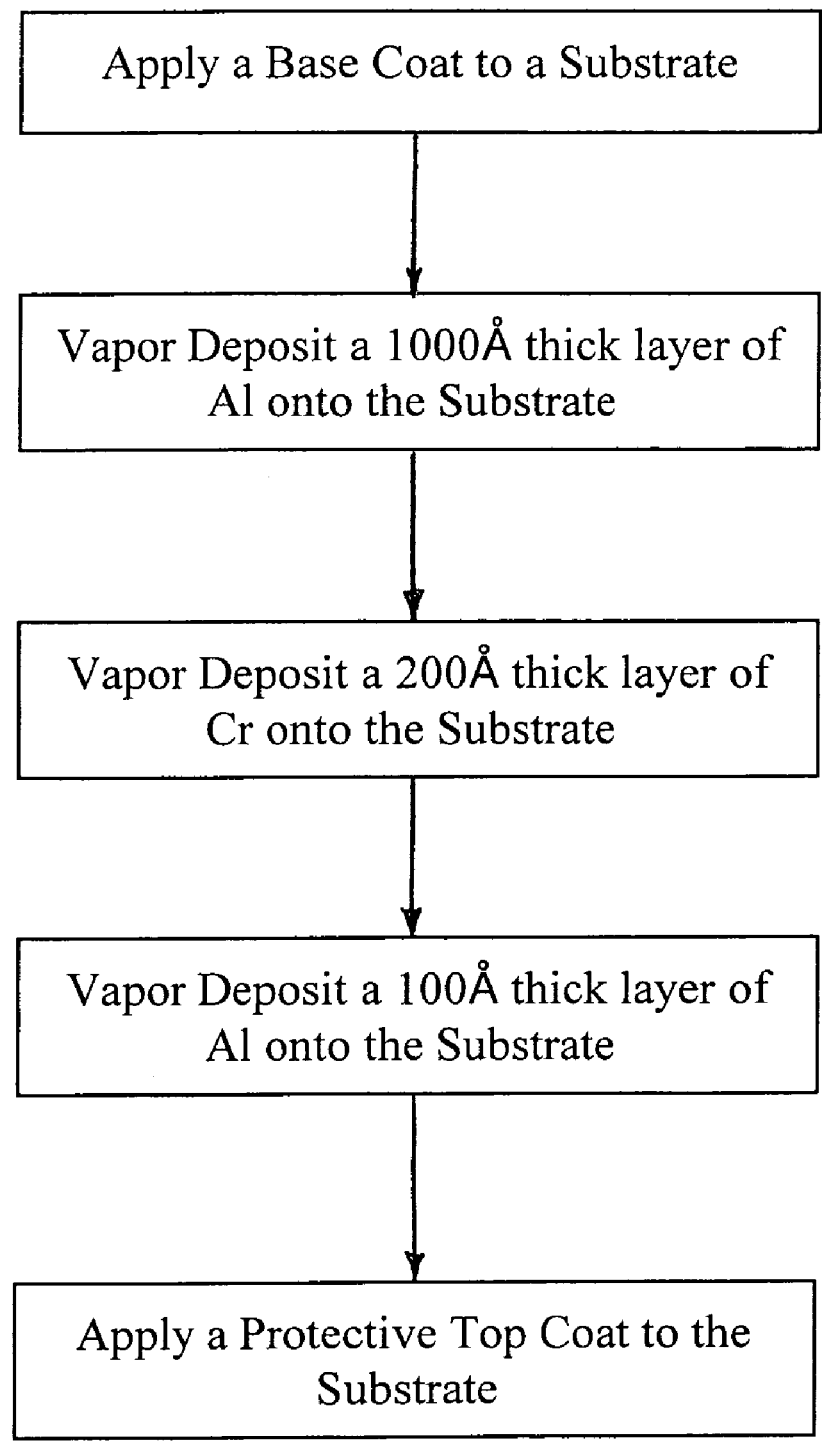
FIG. 1 is a diagram showing a process according of the present invention.
Figure 2:
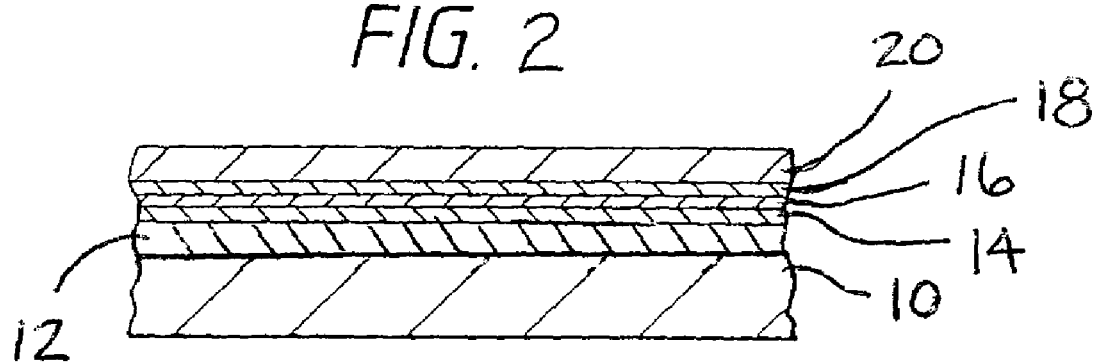
FIG. 2 is a cross-sectional view of a coated substrate according to the present invention.

One chroming process according to the present invention is illustrated by FIGS. 1 and 2. An optional first step is to ensure that the surface of a substrate 10 is smooth and glass-like. This can be accomplished by cleaning and then painting, or applying, a base coat, or primer, 12 on the surface of the substrate 10. Examples of cleaning techniques and base coats are disclosed, for instance, in U.S. Pat. No. 6,399,152 B1 issued to Goodrich, the disclosure of which is incorporated herein by reference.

Thereafter, aluminum is vapor deposited by physical vapor deposition (PVD) on the substrate 10. For example, an aluminum sputtering target of 99% purity can be utilized in a vacuum chamber of magnetron sputtering equipment to vapor deposit the aluminum on the substrate. Preferably, the aluminum is applied to form a uniform layer 14 that is at least 1000 Å in thickness and that comprises at least about 99% aluminum by weight.

Aluminum has very high reflectivity and is a very soft material which can be flexed without damage; but, by itself, is not a suitable substitute for chrome plating. Since aluminum is soft, it does not have good corrosion resistance and does not perform well in Salt Spray tests used to determine the likely outcome of an automotive coating exposed to road conditions. In addition, the high reflectivity of aluminum provides too harsh an appearance that is not desired by the automotive industry and that does not sufficiently match the traditional appearance of chrome plated parts. The layer 14 according to the present invention is utilized to provide the multilayer metallic coating of the present invention with flexibility and a desired optical reflective base surface.

A layer 16 of chromium is vapor deposited by physical vapor deposition (PVD) on layer 14. For example, a chromium sputtering target of 99% purity can be utilized in a vacuum chamber of magnetron sputtering equipment to vapor deposit chromium on the aluminum coated substrate. Preferably, the chromium is applied to form a uniform layer 16 that is about 200 Å thick and that comprises at least about 99% chromium by weight. The layer 16 of chromium is utilized to provide the overall coating with hardness so that the coating will be resistant to corrosion.

Thereafter, a further layer 18 of aluminum is vapor deposited by physical vapor deposition (PVD) on layer 16. For example, an aluminum sputtering target of 99% purity can be utilized in a vacuum chamber of magnetron sputtering equipment to vapor deposit the aluminum on the substrate. Preferably, the aluminum is applied to form a uniform layer 18 that is about 100 Å thick and that comprises at least about 99% aluminum by weight. This thin outer layer of aluminum enhances the brightness of the overall coating and enables the coating to provide an appearance substantially identical to that of plated chrome and/or nickel/chrome. The thickness of layer 18 can be adjusted to compensate for the effects of a protective top coating 20 which may increase or decrease the brightness of the overall multilayer metallic coating. Thus, the optical qualities of a thin layer of aluminum are utilized to provide the substrate with a desired appearance.

An optional final step is to apply a top protective coating 20 to the substrate 10 over the three vapor deposited metallic layers, 14, 16 and 18. See FIG. 2. The top protective coating can be a clear paint or the like, for instance, as disclosed in U.S. Pat. No. 6,399,152 B1 issued to Goodrich.

A coated substrate 10 made in accordance with the above described method performs well on flexible substrates and can be thermally cycled without damage. In addition, the coated substrate 10 performs well in Salt Spray tests and possesses the requisite hardness and appearance needed for chrome coated automotive parts.

Figure 5:
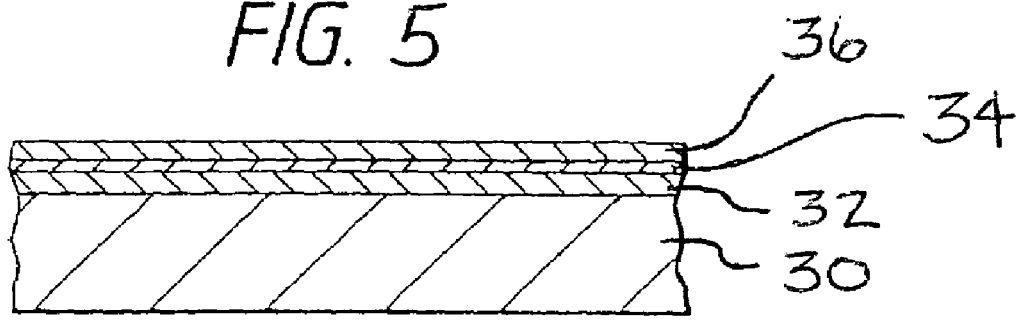
FIG. 5 is a cross-sectional view of a an alternate embodiment of a coated substrate according to the present invention.

An alternate embodiment of a coated substrate 30 according to the present invention is illustrated in FIG. 5. Unlike the three-layer vapor deposited metallic coating of the substrate 10 in which a thin layer 16 of chromium is sandwiched between inner and outer layers, 14 and 18, of aluminum, substrate 30 has just a single vapor deposited metallic layer 34. Preferably, layer 34 is located on a base coat layer 32 (similar to layer 12 described above) and is covered by a protective top coating 36 (similar to layer 20 described above).

Figure 3:
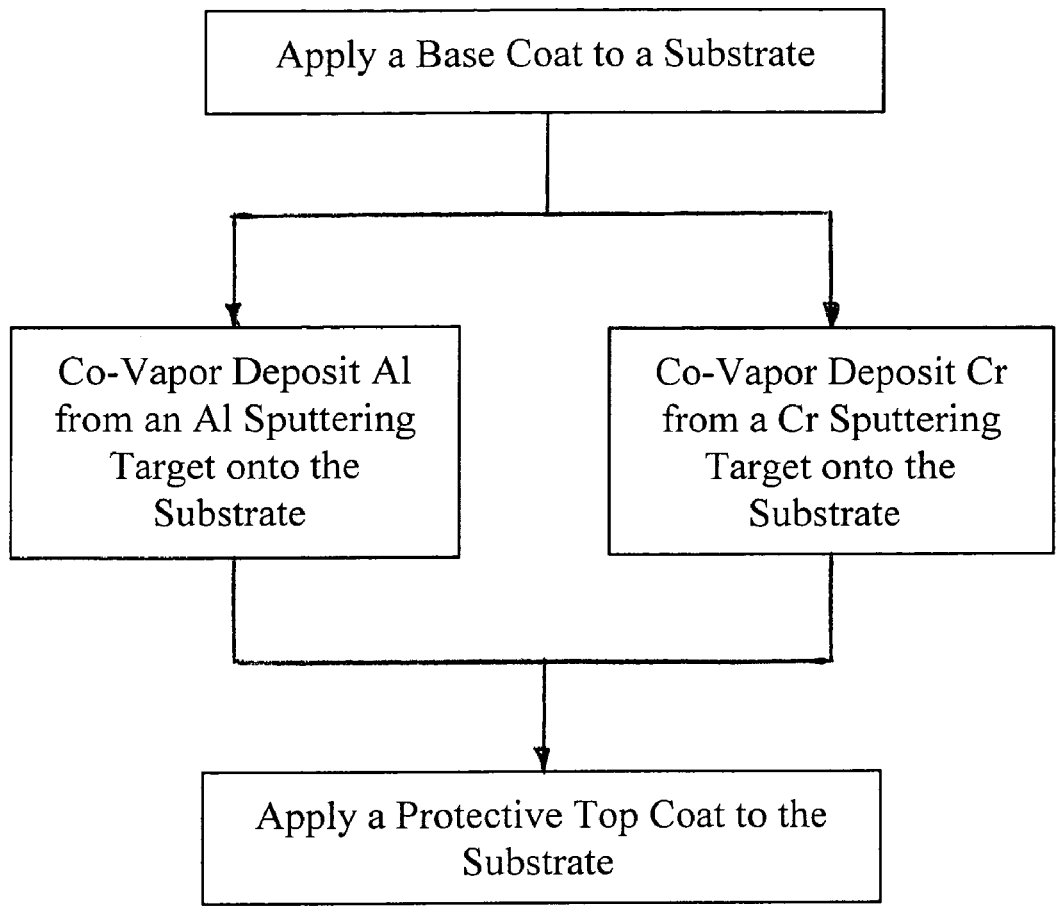
FIG. 3 is a diagram showing a first alternate process according to the present invention.

As best illustrated by the block diagram of FIG. 3, the vapor deposited metallic layer 34 on substrate 30 can be co-deposited by physical vapor deposition (PVD). For example, one or more aluminum sputtering targets of 99% purity and one or more separate chromium sputtering targets of 99% purity can be mounted within the same vacuum chamber of magnetron sputtering equipment to simultaneously vapor deposit the aluminum and chromium on the substrate 30. Preferably, the aluminum and chromium are co-deposited on the substrate 30 to form a layer 34 consisting essentially of 10% to 70% by weight chromium and 30% to 90% aluminum. The aluminum/chromium layer 34 is preferably applied to a minimum thickness of 1000 Å. This minimum thickness ensures that the desired traditional chrome plating appearance is provided.

The ratio of aluminum to chromium can be adjusted within the above specified ranges as a function of processing parameters and substrate material and to compensate for any increase or decrease in brightness caused by the type of protective top coating 36 utilized on the substrate 30.

The reflectivity of chromium films are highly susceptible to residual vacuum contaminants as well as contaminants produced by out gassing of substrates, in particular, plastic substrates and/or base coatings used on such substrates which are limited to low temperature or ultraviolet curing. Chromium films produced by sputtering are also susceptible to the pressure at which they are deposited. For example, a chromium film produced at 1 mtorr argon pressure is typically 30% more reflective than the same film produced at 5 mtorr. Films produced according to the present invention at the low end of the stated composition range are very tolerant of process conditions and residual/induced contaminants. Thus, a preferred range for plastic substrates is about 10% to about 30% by weight chromium and about 70% to about 90% aluminum.

As the ratio of chromium to aluminum increases, process tolerance decreases, enhanced brightness decreases, and flexibility decreases; however, corrosion resistance increases, abrasion resistance increases, and the coefficient of the material decreases. Such attributes are preferable for metal and glass substrates. With respect to metal substrates which typically require enhanced corrosion resistance, a ratio in the middle of the above stated ranges is preferred. For example, the aluminum/chromium layer 34 on a metal substrate can be about 30% to about 50% by weight chromium and about 50% to about 70% aluminum. With respect to glass substrates, a lower coefficient of expansion is desired. For instance, a pure aluminum film will delaminate from a glass substrate when thermally cycled to about 150° C.; however, delamination is reduced in a chromium/aluminum film as chromium content is increased and is substantially eliminated within the upper portion of the above stated ranges according to the present invention. For example, the aluminum/chromium layer 34 on a glass substrate according to the present invention is preferably about 50% to about 70% by weight chromium and about 30% to about 50% aluminum.

Accordingly, a coated substrate 30 made in accordance with the above described method performs well on flexible substrates and can be thermally cycled without damage. In addition, the chromium imparts high corrosion resistance to the coating while the aluminum permits the coating to be flexible. This single vapor deposited metallic layer is particularly useful on large substrates having complex geometries. This is because the use of multi-step processes on such substrates is difficult, and it is impossible to uniformly apply each layer over the entire substrate. In addition, the non-uniformity of multilayer metallic coatings can cause non-uniform coloration of the coated substrate. In contrast, after the bulk minimum thickness of layer 34 is applied according to the present invention, there is no perceptible difference in color as the thickness uniformly, or non-uniformly, increases.

Figure 4:
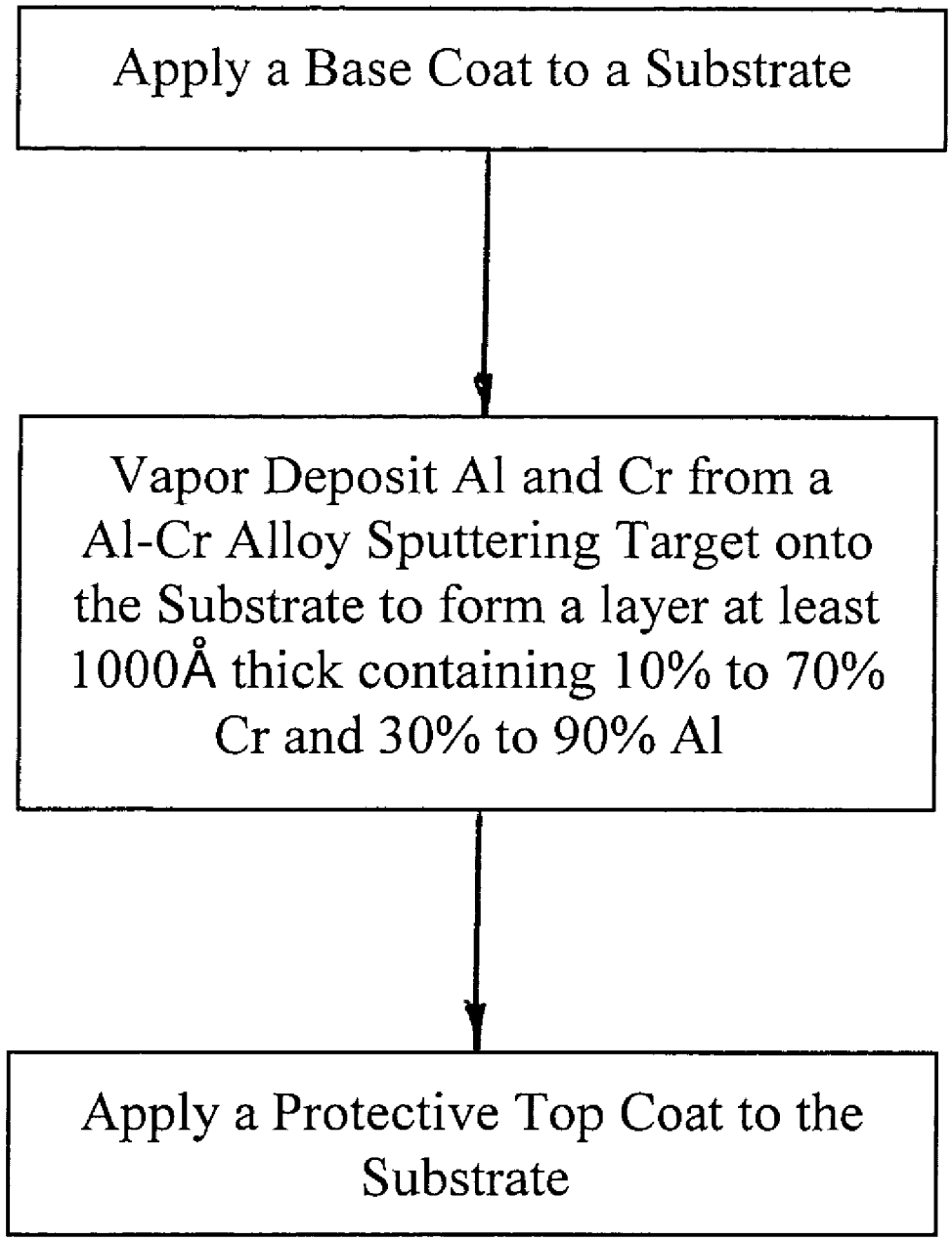
FIG. 4 is a diagram showing a second alternate process according to the present invention.

In an alternate process illustrated by the block diagram of FIG. 4, the vapor deposited metallic layer 34 is formed on substrate 30 via the use of a pre-alloyed sputtering target. For example, an alloy of 10% to 70% by weight chromium and 30% to 90% by weight aluminum can be used as the raw material from which a sputtering target is manufactured. One or more of the alloyed sputtering targets can be mounted within a vacuum chamber of magnetron sputtering equipment to vapor deposit aluminum and chromium onto the substrate 30. Preferably, the aluminum and chromium are deposited to form a layer 34 comprised of 10% to 70% by weight chromium and 30% to 90% aluminum, and preferably the layer 34 has a minimum thickness of 1000 Å for the reasons discussed above. The ratio of aluminum to chromium can be adjusted as discussed above with respect to substrate material, processing conditions, and desired attributes.

The above described process utilizing an alloyed sputtering target further simplifies the chroming process and reduces PVD hardware requirements in half. For instance, each material to be applied simultaneously to a substrate requires a separate deposition source and power supply, and large and complex substrates require multiple sources for each material to be applied to achieve full coverage. Large deposition sources cost tens of thousands of dollars for each source as well as each accompanying power supply.

While preferred processes and coated substrates have been described in detail, various modifications, alterations, and changes may be made without departing from the spirit and scope of the retractor according to the present invention as defined in the appended claims.

The invention claimed is:

1. A process for providing a chrome finish on a substrate, comprising the step of applying a thin film of aluminum and chromium by physical vapor deposition onto the substrate, wherein said applying step consists of the steps of:
   vapor depositing a first layer of aluminum of a thickness of at least 1000 Å to the substrate;
   after said first layer of aluminum is deposited, vapor depositing a layer of chromium of a thickness of about 200 Å on said vapor deposited layer of aluminum; and
   after said layer of chromium is deposited, vapor depositing a second layer of aluminum on said vapor deposited layer of chromium.

2. A process according to claim 1, wherein said second layer of aluminum is applied to a thickness of about 100 Å.

3. A process according to claim 1, wherein the substrate is made of a material selected from the group consisting of glass, plastic, automotive plastics, metal, steel, and aluminum.

4. A process according to claim 3, wherein the substrate is an automotive part.

5. A process according to claim 1, further comprising the step of applying a top protective coating onto said thin film.

6. A process for providing a chrome finish on a substrate, comprising the step of applying a thin film of aluminum and chromium by physical vapor deposition onto the substrate, wherein said applying step consists of simultaneously co-depositing aluminum and chromium on the substrate such that said thin film is formed of 10% to 70% by weight chromium and 30% to 90% by weight aluminum and is of a thickness of at least 1000 Å, said co-depositing step including the use of at least one aluminum and chromium alloy sputtering target in a vacuum chamber, said aluminum and chromium alloy sputtering target comprising 10% to 70% by weight chromium and 30% to 90% by weight aluminum.

7. A process according to claim 6, wherein the substrate is made of a material selected from the group consisting of glass, plastic, automotive plastics, metal, steel, and aluminum.

8. A process according to claim 7, wherein the substrate is an automotive part.

9. A process according to claim 6, further comprising the step of applying a top protective coating onto said thin film.

10. A process according to claim 6, further comprising the step of applying a base coat to the substrate before said step of applying said thin film so that the substrate has a smooth outer surface on which said thin film is deposited.

11. A process for providing a chrome finish on a substrate, comprising the steps of applying a thin film of aluminum and chromium by physical vapor deposition onto the substrate and applying a base coat to the substrate before said step of applying said thin film so that the substrate has a smooth outer surface on which said thin film is deposited, wherein said step of applying said thin film consists of the steps of:
   vapor depositing a first layer of aluminum to the substrate;
   after said first layer of aluminum is deposited, vapor depositing a layer of chromium on said vapor deposited layer of aluminum; and
   after said layer of chromium is deposited, vapor depositing a second layer of aluminum on said vapor deposited layer of chromium.

12. A process according to claim 11, wherein the substrate is made of a material selected from the group consisting of glass, plastic, automotive plastics, metal, steel, and aluminum.

13. A process according to claim 11, wherein the substrate is an automotive part.

14. A process according to claim 11, further comprising the step of applying a top protective coating onto said thin film.

* * * * *